(12) United States Patent
Shambaugh

(10) Patent No.: US 7,001,556 B1
(45) Date of Patent: Feb. 21, 2006

(54) NANOTUBE/MATRIX COMPOSITES AND METHODS OF PRODUCTION AND USE

(75) Inventor: Robert L. Shambaugh, Norman, OK (US)

(73) Assignee: The Board of Regents University of Oklahoma, Norman, OK (US)

(*) Notice: Subject to any disclaimer, the term of this patent is extended or adjusted under 35 U.S.C. 154(b) by 200 days.

(21) Appl. No.: 10/223,559

(22) Filed: Aug. 16, 2002

Related U.S. Application Data

(60) Provisional application No. 60/312,980, filed on Aug. 16, 2001.

(51) Int. Cl.
*B82B 3/00* (2006.01)
*D01F 1/10* (2006.01)
*D01F 6/06* (2006.01)

(52) U.S. Cl. .................. 264/210.6; 264/210.8; 264/211; 423/445 B; 977/DIG. 1

(58) Field of Classification Search ............ 264/210.6, 264/210.8, 211; 423/455 B
See application file for complete search history.

(56) References Cited

U.S. PATENT DOCUMENTS

| 4,663,230 A | 5/1987 | Tennent ...................... 428/367 |
| 5,165,909 A | 11/1992 | Tennent et al. ............. 423/447 |
| 5,482,601 A | 1/1996 | Ohshima et al. ............ 204/173 |
| 5,543,378 A | 8/1996 | Wang .......................... 502/174 |
| 5,578,543 A | 11/1996 | Tennent et al. ............. 502/180 |
| 5,648,056 A | 7/1997 | Tanaka ....................... 423/445 |
| 5,707,916 A | 1/1998 | Snyder et al. ............... 502/180 |
| 5,744,235 A | 4/1998 | Creehan ..................... 428/364 |
| 5,753,088 A | 5/1998 | Olk ............................. 204/173 |
| 5,773,834 A | 6/1998 | Yamamoto et al. ......... 250/423 |
| 5,780,101 A | 7/1998 | Nolan et al. ................ 427/216 |
| 5,877,110 A | 3/1999 | Snyder et al. ............... 502/180 |
| 6,099,965 A | 8/2000 | Tennent et al. ............. 428/408 |

(Continued)

FOREIGN PATENT DOCUMENTS

EP 0461464 A1 12/1991

(Continued)

OTHER PUBLICATIONS

Sandler et al., "Development of a dispersion process for carbon nanotubes in an epoxy matrix and the resulting electrical properties", Polymer(40), (1999), pp. 5967-5971.

(Continued)

*Primary Examiner*—Leo B. Tentoni
(74) *Attorney, Agent, or Firm*—Dunlap, Codding & Rogers, P.C.

(57) ABSTRACT

A nanotube/matrix composite mixture, and a method of producing it, which can be used to form a composite material such as a drawn fiber having an increased strength over a drawn fiber formed from the matrix material alone. Nanotubes are combined with a solvent material to form a nanotube/solvent mixture. The nanotube/solvent mixture is mixed, for example by sonication, such that the nanotubes are uniformly dispersed in the nanotube/solvent mixture. An amount of a matrix material (with or without a solvent) is then combined with the nanotube/solvent mixture to form a nanotube/solvent/matrix mixture. The nanotube/solvent/ mixture and the matrix material are mixed such that the nanotubes are maintained in uniformly dispersed state in the nanotube/solvent/matrix mixture, for example by continued sonication after the nanotubes and matrix material are combined. The solvent material is then substantially removed from the nanotube/solvent/matrix mixture to form the nanotube/matrix composite mixture, which can then be used in a commercial process to produce a composite material such as drawn fiber, as produced, for example, by melt spinning.

20 Claims, 3 Drawing Sheets

U.S. PATENT DOCUMENTS

| | | | |
|---|---|---|---|
| 6,299,812 B1 | 10/2001 | Newman et al. | 264/176.1 |
| 6,331,265 B1 | 12/2001 | Dupire et al. | 264/289.3 |
| 6,426,134 B1 | 7/2002 | Lavin et al. | 428/300.1 |
| 6,432,866 B1 | 8/2002 | Tennent et al. | 502/180 |

FOREIGN PATENT DOCUMENTS

| | | |
|---|---|---|
| EP | 0545210 A1 | 6/1993 |
| EP | 1054036 A1 | 11/2000 |
| WO | 9839250 A1 | 8/1998 |
| WO | 9842620 A1 | 10/1998 |

OTHER PUBLICATIONS

Vincent, B.; "The Stability of Solid/Liquid Dispersions in the Presence of Polymers"; 1 page; 1987.

Harris; "Carbon Nanotube and Related Structures"; 6 pages, undated.

Garg, A., Sinnott, S.; "Effect of Chemical Functionalization on the Mechanical Properties of Carbon Nanotubes"; Chemical Physical Letters; 6 pages; Oct. 16, 1998.

Schadler, L., Giannaris, S., Ajayan, P.; "Load Transfer in Carbon Nanotube Epoxy Composites"; Applied Physics Letters; vol. 73, No. 26; 3 pages; Dec. 28, 1998.

Shaffer, M., Windle, A.; "Fabrication and Characterization of Carbon Nanotube/Poly(vinyl Alchohol) Composites"; Advanced Materials; 5 pages; 1999.

Bower, C., Rosen, R., Jin, L., Han, J., Zhou, O.; "Deformation of Carbon Nanotubes in Nanotube-Polymer Composites"; Applied Physics Letters; vol. 74, No. 22; 3 pages; May 31, 1999.

Andrews, R., Jacquees, D., Rao, A.M., Rantell, T., Derbyshire, F.; "Nanotube Composite Carbon Filters"; Applied Physics Letters; vol. 75, No. 9; 3 pages; Aug. 30, 1999.

Gong, X., Liu, J., Baskaran, S., Voise, R., Young, J.; "Surfactant-Assisted Processing of Carbon Nanotube/Polymer Composites"; American Chemical Society; 4 pages; Oct. 12, 1999.

Haggenmueller, R., Gommans, H., Rinzler, A., Fischer, J., Winey, K.; "Aligned Single-Wall Carbon Nanotubes in Composites by Melt Processing Methods"; Chemical Physical Letters; 7 pages; Nov. 10, 2000.

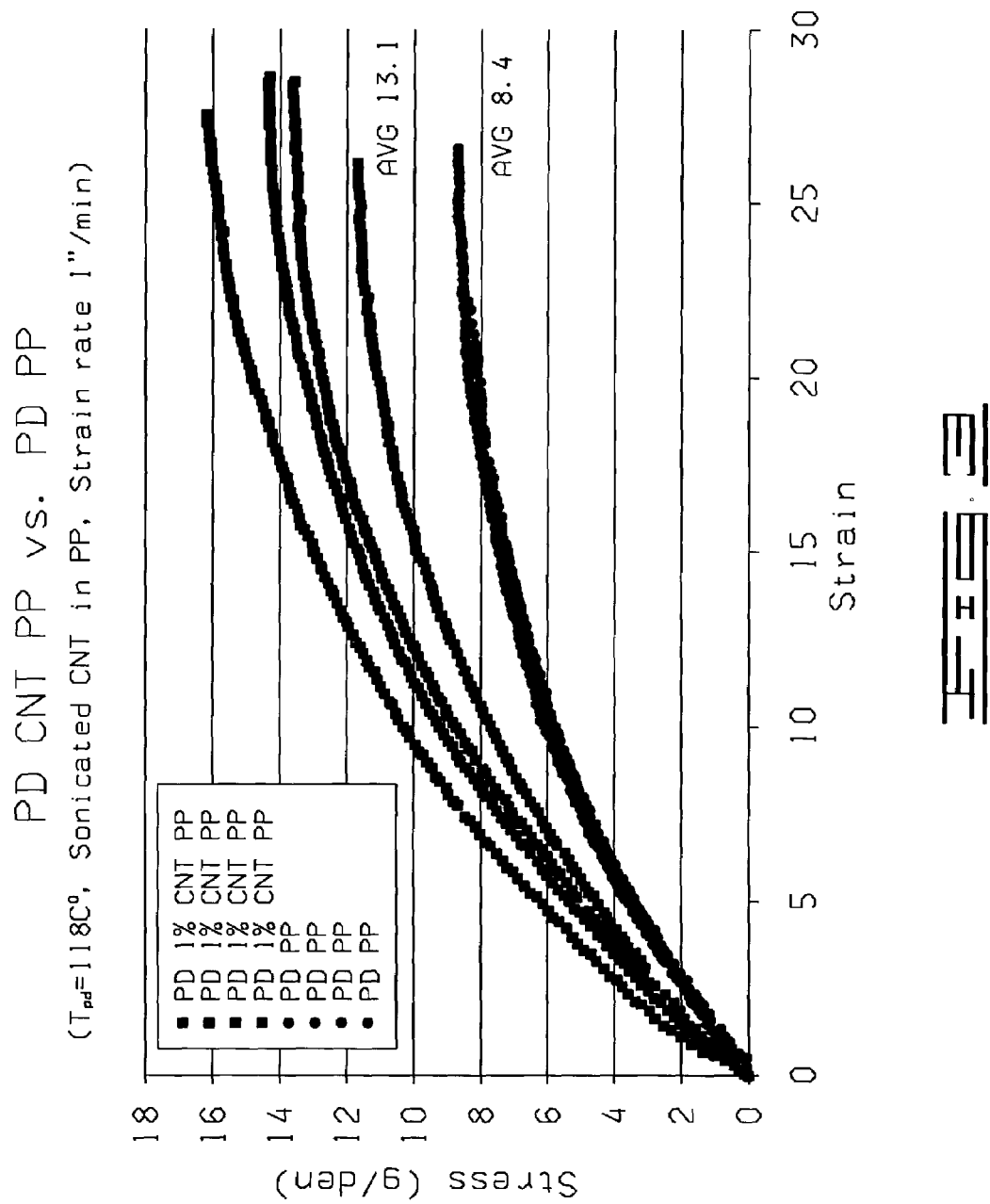

NANOTUBE/MATRIX COMPOSITES AND METHODS OF PRODUCTION AND USE

CROSS-REFERENCE TO RELATED APPLICATIONS

This application claims the benefit of the filing date of U.S. Provisional Application 60/312,980, filed Aug. 16, 2001, the specification and drawings of which are hereby expressly incorporated by reference herein in their entirety.

STATEMENT REGARDING FEDERALLY SPONSORED RESEARCH AND DEVELOPMENT

Not applicable.

BACKGROUND OF THE INVENTION

For sheets and films, a number of investigators have used nanotubes as the reinforcement in a nanotube/polymer composite. For example, Schadler et al. (1998) and Gong et al. (2000) produced composites of nanotubes in epoxy. Shaffer and Windle (1999) examined a nanotube/poly(vinyl alcohol) composite. Bower et al. (1999) fabricated a composite with nanotubes in a polyhydroxyaminoether. Unless sheets and films are unusually thin, they can also be reinforced with more normally-sized (e.g., diameters of 100 microns or more) reinforcement. However, nano-scale reinforcement is uniquely suited for strengthening polymer fibers, since the fibers themselves are typically only 10 to 100 microns in diameter. Since nanotubes are orders of magnitude smaller in diameter, a nanotube cannot occlude a high fraction of the fiber cross-section.

Presently, fibers produced from "commodity" polymers (e.g., polyester, polypropylene, and nylon) have tensile strengths from about 0.15 to 0.6 Gpa. More expensive "specialty" fibers (such as Kevlar® and PAN carbon fiber) have strengths of about 2 to 5 Gpa. The recently discovered carbon nanotubes have a theoretical strength of 200 Gpa (Schadler et al., 1998)—about 40 times higher than existing materials. However, capitalizing on this potential strength has thus far been problematic.

Several research teams have used single walled carbon nanotubes (SWNTs) to enhance the strength of neat fibers. Andrews et al. (1999) dispersed SWNTs in isotropic petroleum pitch. With a 5 wt % loading, the tensile strength and modulus were increased 90 and 150%, respectively. Haggenmueller et al. (2000) reinforced PMMA (polymethyl methacrylate) with SWNTs. They found a 54% increase in tensile strength and a 94% increase in modulus when an 8 wt % loading of nanotubes was used.

Most multiwalled carbon nanotubes (MWNTs) are believed to have the "Russian doll" structure where only weak van de Waal forces bond one tube to another (Harris, 1999). Hence, the outer layers of MWNTs could slide or telescope relative to each other (Schadler et al., 1998; Shaffer and Windle, 1999). However, kinks and defects could help prevent this sliding (Harris, 1999). Ruoff and Lorents (1996) believe that SWNTs are preferable to MWNTs because SWNTs are easier to bond than MWNTs. These researchers also feel that the tensile strength of the modified SWNTs might be affected by bonding. However, Garg and Sinnott (1998; also see Harris, 1999) showed in theoretical calculations that covalent attachments only decrease SWNT strength by about 15%.

Carbolex® AP Grade Nanotubes is a type of commercially available nanotube material. Carbolex® AP Grade Nanotubes is an "as prepared" nanotube material that contains about 70% SWNT and is produced by a carbon arc process. Previous investigators have used ultrasonic mixing (Schadler et al., 1998) or mechanical mixing and a surfactant (Gong et al., 2000) in attempts to disperse material of this type. However, both of these investigative teams reported that dispersion was not uniform, and that further work was needed. With the unique size range of nanotubes, the phase behavior of nanotubes in polymers will probably affect their dispersion. For submicron particles, phase separation processes occur which are not observed in macroscopic (micron-scale) systems. In particular, colloidal crystals are produced which depend on the form of interparticle forces (Calvert, 1997; Milling et al., 1991; Vincent, 1987).

Melt spinning involves polymers that are melt processable (thermoplastic). The polymer is melted, pressurized, and forced through a fine capillary. The fiber can be drawn down with either a mechanical roll (with speeds up to 10,000 m/min) or with air jets (with speeds to 30,000 m/min). If the air jets are placed in the melt die, this process is called melt blowing. The speeds possible with melt spinning are orders of magnitude higher than the speeds used in solution spinning. Hence, melt spinning is an inherently less expensive process for producing fibers.

BRIEF DESCRIPTION OF THE DRAWINGS

FIG. 3 is a chart illustrating the increase in strength of fibers produced in accordance with the present invention compared to fibers produced by prior art methods.

DETAILED DESCRIPTION OF THE INVENTION

Figure 1:
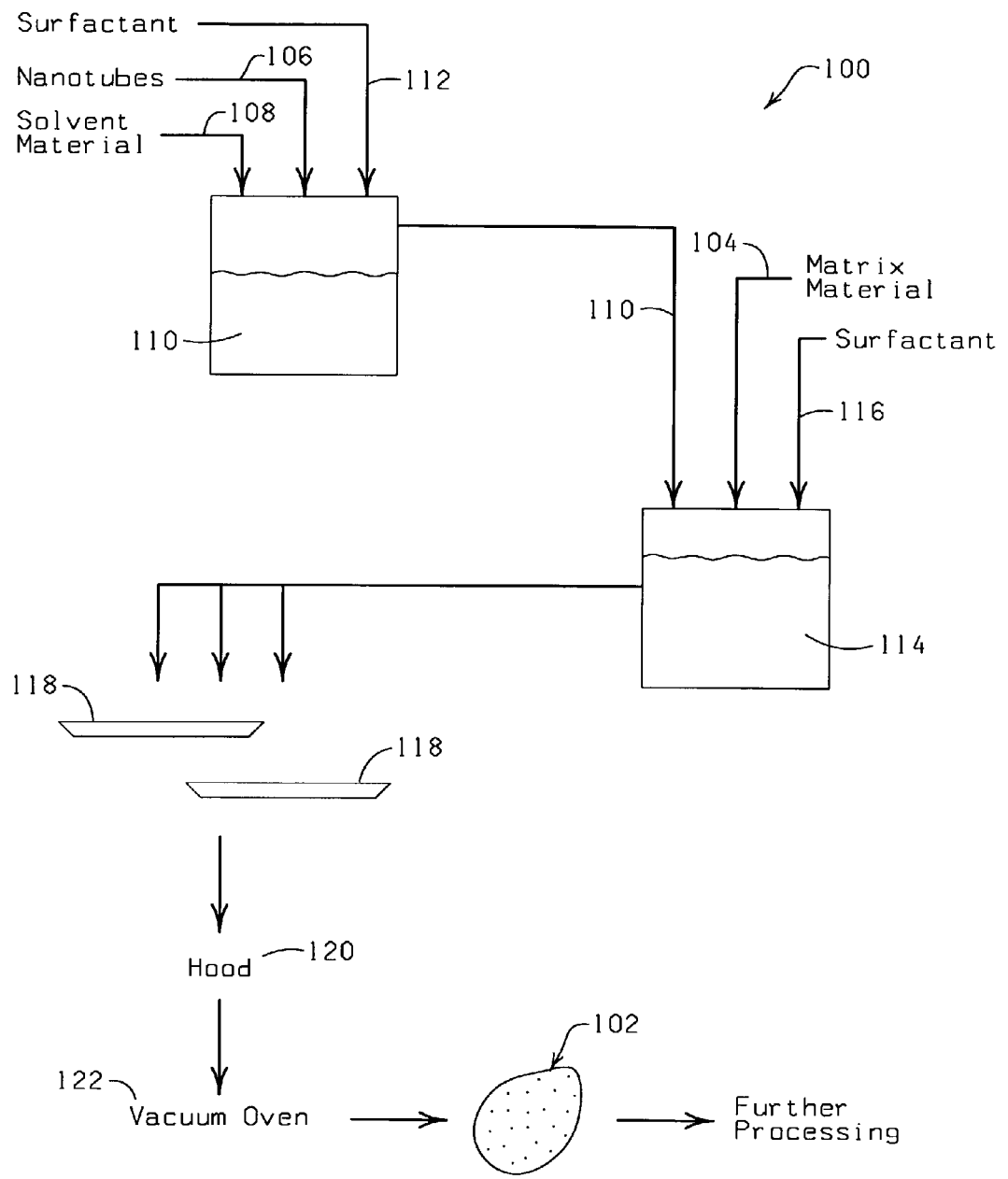
FIG. 1 is a schematic representation of a process for producing a composite mixture utilizing at least one solvent, in accordance with the present invention.

The present invention is a method for producing single walled carbon nanotube/matrix composite materials which preferably have an anisotropic structure and which can be commercially produced utilizing commercially available equipment. In general, effective amounts of nanotubes, preferably single walled carbon nanotubes, are mixed with a matrix material to form a composite mixture, generally containing less than about 5 weight percent of the nanotubes to about parts per billion of the nanotubes and wherein the nanotubes are preferably generally randomly oriented in the composite mixture. The composite mixture is then passed through an orifice or a capillary (e.g., extruded) to form an extrudate or composite material. Shear attenuation pressure is applied about the extrudate, either as the extrudate passes through the orifice or capillary, and/or after the extrudate passes through the orifice or capillary, wherein the nanotubes are preferably substantially aligned within the polymer with the longitudinal axis of the extrudate. The shear attenuation pressure is preferably applied through a melt blowing process, although, other processes could also be utilized to provide the shear attenuation pressure to the extrudate, such as a melt spinning process, or a gel spinning process. Examples of such methods are shown in U.S. Pat. No. 6,299,812, the entire specification of which is hereby expressly incorporated herein by reference.

The term "matrix material" as used herein, broadly refers to any composition capable of functioning as the matrix constituent of the materials produced by the present invention. Examples of suitable matrix materials which can be employed in the practice of the present invention, include, but are not limited to, metal, glass, metal alloy, metal oxide glass or alloy thereof, polymer, such as a thermoplastic resin, or any suitable blend thereof that can be prepared to have a viscosity suitable for extruding, stretching, shearing or otherwise deforming of the composite mixture containing the matrix material and the nanotubes preferably in a direction whereby an anisotropic structure, e.g., an enhanced orientation/alignment of the fibers within the composite mixture is created, in the direction the composite mixture has been pulled, stretched, extruded, sheared, and combinations thereof or otherwise deformed and which can be mixed with the nanotubes. Any polymer capable of achieving the above described results can be utilized as the matrix. Examples of matrix materials which will function as a "matrix material" as used herein, are polyethylene, poly(para-phenylenevinylene), polypyrrole, polypropylene, nylon-6, polystyrene, polytrifluorochloroethylene and Resin Epon-812 and combinations thereof. Further, the "matrix material" could be organic/inorganic hybrid based.

A suitable viscosity of the nanotube/matrix composite mixture can be adjusted so that the composite mixture can be pulled, stretched, extruded, sheared, or otherwise deformed by any suitable process, such as melting the composite mixture to form a composite material.

For example, the transformation of the composite mixture having the nanotubes into the nanotube/matrix composite material having an anisotropic structure can be enhanced by increasing the temperature of the composite mixture up to and above a temperature where the matrix phase is considered a melted phase. By further increasing the temperature of the composite mixture its viscosity will decrease thus enhancing its fluid or fluid-like properties thus further enhancing its ability to be stretched, pulled, extruded, or combinations thereof or otherwise deformed in a preferential direction.

As a further example, the transformation of the composite mixture into a composite material having an anisotropic structure may, in some instances, be enhanced by the addition of a solvent that dissolves portions of some or all of the components considered to compose the matrix material of the composite mixture as described further below. The solvent dissolution of the matrix material increases its fluid or fluid-like properties and by doing so allows its deformation with less force and thus increases its ability to be stretched, pulled, extruded, or otherwise deformed in a preferential direction. Only those small volumes of solvents are required that contribute to lower viscosity of the composite mixture while simultaneously maintaining the self adhesive quality of the matrix phase in such a way that it maintains its self continuity and may be still stretched, pulled, extruded or otherwise deformed.

Further, plastic deformation of materials including some metals and metal alloys may be accomplished by the application of significant pressures or forces. Likewise, the application of pressure to the composite mixture can improve, create and/or initiate the stretching, pulling, extruding, or deforming of the composite mixture. Therefore, depending on the particular properties of the composite mixture, low to extremely high pressures can contribute to formation of the preferentially aligned fibers within the composite mixture by aiding the composite mixture in being deformed, stretched, extruded, pulled or otherwise linearized into a fiber, tube, or rope-like form.

Examples of processes that transform bulk mixtures into composite materials such as fibers, tubes or rope-like structures are those processes known in the art as "wet spinning", "gel spinning", "melt spinning", "melt blowing", or "extrusion". These processes are well known in the art and a detailed discussion of each of these processes is not deemed necessary to teach one of ordinary skill in the relevant art to make and use the present invention.

Referring now to the Figures, shown in FIG. 1 and designated therein by the reference numeral 100, is a schematic representation of a process for producing a nanotube/matrix composite mixture 102 utilizing at least one solvent, in accordance with the present invention. The nanotube/matrix composite mixture 102 includes a matrix material 104 having a uniform dispersion of nanotubes 106 contained therein. Preferably the nanotubes comprise 70–90% single walled carbon nanotubes, more preferably 90–95% single walled carbon nanotubes, and most preferably at least 98% single walled carbon nanotubes.

In an example which will be discussed in more detail below, the nanotube/matrix composite mixture 102 contains about 1% by weight of nanotubes. The nanotube/matrix composite mixture 102 can then be used to form a composite material such as a drawn fiber having an increase in strength in excess of 50% over a drawn fiber formed from the matrix material alone. This substantial and unexpected increase in strength is believed to be due to the method of mixing the nanotubes 106 and the matrix material 104, wherein the nanotubes 106 are maintained in a uniformly dispersed state prior to and during mixing of the nanotubes with the matrix material.

To produce the nanotube/matrix composite mixture 102, an amount of the nanotubes is first combined with a solvent material 108 to form a nanotube/solvent mixture 110. The nanotubes 106 and the solvent material 108 are mixed together in the nanotube/solvent mixture 110 such that the nanotubes 106 are uniformly dispersed in the nanotube/solvent mixture 110.

Where used herein, the term "uniformly dispersed" means, in one embodiment of the invention, that in a sampling of ten one-milliliter samples randomly selected from the nanotube/solvent mixture, or from the nanotube/solvent/matrix mixture, at least nine of the ten one ml samples differ from each other in the amount of nanotubes contained therein by no more than 10% by weight of the nanotubes. In a preferred version of the invention, the sampling comprises ten 100-microliter samples. In a more preferred version of the invention, the sampling comprises ten 10-microliter samples. In an especially preferred version of the invention, the sampling comprises ten 1-microliter samples.

The solvent material 108 is preferably a solvent material which dissolves the matrix material 104 that is being used (e.g., decalin and toluene are known solvents capable of dissolving a matrix material, such as polypropylene).

Other solvents contemplated for use in the present invention include, but are not limited to tetralin and tetrachlorethane e.g., for polypropylene; acetone, e.g., for polystyrene; cyclohexanone, methyl cyclohexanone, dimethyl foramide, nitrobenzene, tetrahydrofuran, isophonone, mesityl oxide, dipropyl ketone, methyl amyl ketone, methyl isobutyl ketone, acetonyl acetate, methyl ethyl ketone, dioxone, and methylene chloride, e.g., for polyvinyl chloride; and trichlorobenzene, e.g., for polyethylene. Other examples of solvents for the thermoplastic resins used as matrix materials herein will readily come to mind to persons of ordinary skill in the art.

The nanotubes 106 and the solvent material 108 can be mixed by any suitable method for any suitable period of time so as to uniformly disperse the nanotubes 106 in the nanotube/solvent mixture 110. For example, the nanotubes 106 and the solvent material 108 can be mixed by mechanical mixing, shaking, sonification, stirring, or the like. The most preferredly method is sonication. Optionally, a surfactant 112 can be added to the nanotube/solvent mixture 110 to enhance dispersion of the nanotubes 106.

Where used herein in reference to nanotubes or single walled carbon nanotubes, the term "substantially unbroken" means that the average length of a random sampling of the nanotubes in the mixture after the predetermined mixing period is at least about 80% of the average length of a random sampling of the nanotubes before the mixing step was initiated.

In addition, the temperature of the nanotube/solvent mixture 110 can be increased or varied to enhance the uniform dispersion of the nanotubes 106 in the nanotube/solvent mixture 110 as further described below.

An amount of matrix material 104 is then combined with the nanotube/solvent mixture 110 to form a nanotube/solvent/matrix mixture 114. The amount of matrix material 104 combined with the nanotube/solvent mixture 110 can vary depending on the particular matrix material 104 selected, and the particular types of nanotubes 106 and solvent material 108 contained in the nanotube/solvent mixture 110 and the desired properties of the composite material formed from the nanotube/matrix composite mixture 102. For example, the nanotube/solvent mixture 110 and the matrix material 104 in the nanotube/solvent/matrix mixture 114 are mixed such that the nanotubes 106 are maintained in a uniformly dispersed state in the nanotube/solvent/matrix mixture 114, for example by continued sonication after the nanotubes 106 and matrix material 104 are combined. Optionally, a surfactant 116 can be added to the nanotube/solvent/matrix mixture 114.

In addition, the temperature of the nanotube/solvent/matrix mixture 114 can be increased or varied to enhance the uniform dispersion of the nanotubes 106 and the matrix material 104 in the nanotube/solvent/matrix mixture 114.

The solvent material 108 is then removed from the nanotube/solvent/matrix mixture 114 to form the nanotube/matrix composite mixture 102 preferably containing from about 0% by weight to about 1% by weight to about 2% by weight to about 5% by weight of the solvent material 108. The solvent material 108 can be removed from the nanotube/solvent/matrix mixture 114 via any suitable process known by persons of ordinary skill in the art. For example, the solvent material 108 can be removed by evaporating the solvent material 108 at room temperature and/or elevated temperatures. Also, removal can be effected at atmospheric pressure and/or reduced pressure (vacuum) in a manner well known in the art.

For example, the nanotube/solvent/matrix mixture 114 can be disposed in one or more drying surfaces 118. The drying surface 118 containing the nanotube/solvent/matrix mixture 114 can be placed in a hood 120 to evaporate the solvent material 108 for a suitable period of time of from hours to days.

The drying surface 118 can then be removed from the hood and positioned in a vacuum oven 122 to further evaporate or remove the solvent material 108 for a suitable period of time, and at a suitable temperature and pressure to form the nanotube/matrix composite mixture 102 containing preferably about 0% by weight to about 1% by weight to about 2% by weight to about 5% by weight of the solvent material 108.

In a preferred embodiment, the nanotube/matrix composite mixture 102 will contain roughly 1% by weight of residual solvent material 108 or less; the residual solvent material 108 thereby acting as a plasticizer. Preferably all removed solvent material 108 will be recycled. Since removing and recycling solvent material 108 is expensive, the amount of solvent material 108 will be minimized whenever possible.

After the solvent material 108 has been removed, the nanotube/matrix composite mixture 102 can be crushed into a coarse material (e.g., chunks having a diameter of 0.5 cm or less). The crushed nanotube/matrix composite mixture 102 can then be further processed into a composite material such as fibers, drawn fibers or other products utilizing any suitable process, such as "wet spinning", "gel spinning", "melt spinning", "melt blowing", or "extrusion" as discussed above. These processes are well known in the art and a detailed discussion of each of these processes is not deemed necessary to teach one of ordinary skill in the relevant art to make and use the present invention.

Figure 2:
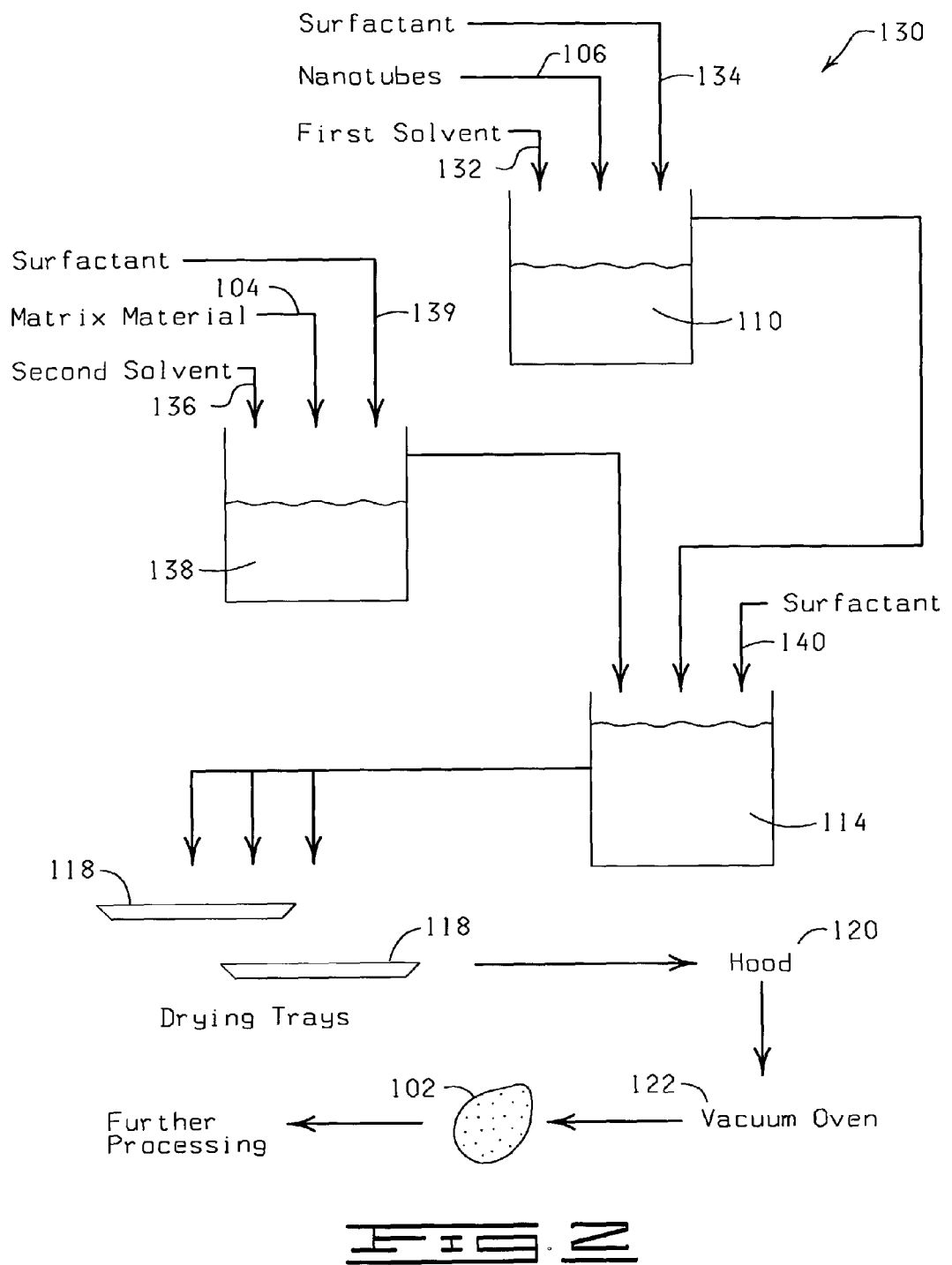
FIG. 2 is a schematic representation of another process for producing a composite mixture utilizing at least one solvent, in accordance with the present invention.

Referring now to FIG. 2, shown therein and designated by the reference numeral 130 is a schematic representation of an alternate process for producing the nanotube/matrix composite mixture 102 utilizing at least one solvent, in accordance with the present invention. To produce the nanotube/matrix composite mixture 102, an amount of the nanotubes 106 is combined with a first solvent material 132 to form the nanotube/solvent mixture 110. The nanotubes 106 and the first solvent material 132 are continuously mixed in the nanotube/solvent mixture 110 wherein the nanotubes 106 are in a uniformly dispersed condition in the nanotube/solvent mixture 110. The first solvent material 132 can be decalin, or any other solvent in which nanotubes can be generally mixed and uniformly dispersed.

The nanotubes 106 and the first solvent material 132 can be mixed by any suitable method so as to uniformly disperse the nanotubes 106 in the nanotube/solvent mixture 110. For example, the nanotubes 106 and the first solvent material 132 can be mixed by mechanical mixing, shaking, stirring, sonification, or the like. In addition, to enhance the mixing and dispersion of the nanotube/solvent mixture 110, a surfactant material 134, such as is commonly known in the art and which is soluble in the first solvent material 132 can be added to the nanotube/solvent mixture 110. In a preferred embodiment, the nanotube/solvent mixture 110 is mixed for about 1 hour prior to being mixed with the matrix material 104, the nanotubes maintained in a uniformly dispersed condition before being mixed with the matrix material.

In addition, the temperature of the nanotube/solvent mixture 110 can be increased or varied to enhance the uniform dispersion of the nanotubes 106 in the nanotube/solvent mixture 110.

An amount of matrix material 104 is combined with a second solvent material 136 (which may be the same or different from first solvent material 32) to form a matrix/solvent mixture 138. The matrix material 104 and the second solvent material 136 are mixed in the matrix/solvent mixture 138 such that the matrix material 104 is dissolved in the matrix/solvent mixture 138. To enhance the mixing of the matrix/solvent mixture 138, a surfactant material 139, such as a non-polar surfactant, can be added to the matrix/solvent mixture 138. The second solvent material 136 is preferably miscible with the first solvent material 132 to optimize mixing. The second solvent material 136 can be any solvent able to dissolve the matrix material 104 as discussed elsewhere herein and which is miscible with the first solvent material 132.

An amount of the matrix/solvent mixture 138 is then combined with the nanotube/solvent mixture 110 to form the nanotube/solvent/matrix mixture 114. The amount and ratio of matrix/solvent mixture 138 combined with the nanotube/solvent mixture 110 can vary depending on the particular matrix material 104 selected, and the particular type of nanotubes 106, and the first and second solvent materials 132 and 136. The nanotube/solvent mixture 110 and the matrix/solvent mixture 138 in the nanotube/solvent/matrix mixture 114 are mixed such that the nanotubes 106 are uniformly dispersed in the nanotube/solvent/matrix mixture 114.

The nanotube/solvent mixture 110 and the matrix material 104 can be mixed by any suitable method for any suitable period of time so as to about uniformly disperse the nanotubes 106 and the matrix material 104 in the nanotube/solvent/matrix mixture 114, as discussed previously above. Optionally, a surfactant 140 can be added to improve mixing.

In addition, the temperature of the nanotube/solvent/matrix mixture 114 can be increased or varied to enhance the dispersion of the nanotubes 106 and the matrix material 104 in the nanotube/solvent/matrix mixture 114.

The first and second solvent materials 132 and 136 are then removed from the nanotube/solvent/matrix mixture 114 to form the nanotube/matrix composite mixture 102 preferably containing about 0% by weight to about 1% by weight to about 2% by weight to about 5% by weight of the first and second solvent materials 132 and 136. The first and second solvent materials 132 and 136 can be removed from the nanotube/solvent/matrix mixture 114 via any suitable process as previously described. For example, the first and second solvent materials 132 and 136 can be removed by evaporating the first and second solvent materials 132 and 136 at room temperature and/or elevated temperatures. Also, removal can be effected at atmospheric pressure and/or reduced pressure (vacuum) as previously discussed.

Preferably, the nanotube/matrix composite mixture 102 will contain roughly 0% to 1% to 2% to 5% by weight of the first and second solvent materials 132 and 136 and preferably less than 1% by weight. The residual first and second solvent materials 132 and 136 can act as a plasticizer. Preferably all removed first and second solvent materials 132 and 136 will be recycled.

While the invention will now be described in connection with certain preferred embodiments in the following examples so that aspects thereof may be more fully understood and appreciated, it is not intended to limit the invention to these particular embodiments. On the contrary, it is intended to cover all alternatives, modifications and equivalents as may be included within the scope of the invention as defined by the appended claims. Thus, the following examples, which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

EXAMPLE 1

In this example, commercial carbon nanotubes (nanotubes 106) were combined with commercially available polypropylene (matrix material 104). More specifically, 150 ml of decalin (solvent material 108) was placed in a 400 ml container. Next, 0.200 g of AP grade CARBOLEX carbon nanotubes were added to the decalin forming a nanotube/solvent mixture. Then, the mixture was sonicated with a Fisher Scientific Model 550 Ultrasonic Generator. The sonification was conducted for 60 minutes at a power setting of "4".

During the sonification, the temperature of the nanotube/solvent mixture gradually rose due to the effects of sonification. After 60 minutes, the temperature of the nanotube/solvent mixture reached about 100° C. and the nanotubes were uniformly dispersed within the decalin. Then, 20 g of polypropylene pellets (matrix material 106) were added to the nanotube/solvent mixture having the nanotubes uniformly dispersed therein. Heat was applied to bring the temperature to 135° C. After another 60 minutes of sonification at power level "4", the polypropylene was totally dissolved to create a nanotube/solvent/matrix mixture with the nanotubes uniformly dispersed therein.

The container of the nanotube/solvent/matrix mixture was placed in a vacuum oven at a temperature of 70° C. and an absolute pressure of 10.1 kPa for two days. The resultant dried nanotube/matrix composite mixture was a coarse powder (the chunks were all 0.5 cm size and less). The final weight of the nanotube/matrix composite mixture was 20.13 g, which indicated that about 0.4 ml (about 0.65% by weight) of the composite mixture was decalin and about 1% was nanotubes.

For forming into a composite material, the nanotube/matrix composite mixture was placed in the barrel of a ram extruder and was then heated to 190° C. The nanotube/matrix composite mixture was extruded out at a mass rate of 0.50 g/min. A 15.2 cm diameter mechanical roll was placed at a distance of 1.35 meters below the spinneret. The roll was run at a surface speed of 519 m/min forming a fiber (the composite material) which was collected on the roll.

The collected nanotube/matrix composite material was then post drawn by passing the fiber through an oven set at 118° C. The oven length was 38 cm, the feed roll (6.5 cm diameter) was run at a surface speed of 1.5 m/min, and the takeup roll (also 6.5 cm diameter) was run at a surface speed of 9 m/min (for a draw ratio of 6×).

The drawn fiber was tested with an Instron tensile test machine at a strain rate of 2.54 cm/min. The results of four replicate tests are given in FIG. 6. Also shown in the graph of FIG. 3 are four replicate tests of the stress-strain behavior of a blank (polypropylene matrix with no nanotubes) subjected to the same processing conditions. As will be understood in the art, the drawn fibers produced in accordance with the present invention had a common stress-strain behavior of 13.1 grams/denier. This surprising and unexpected result represents over a 50% increase of the stress-strain behavior of blank polypropylene matrix (without nanotubes).

The nanotubes utilized in the example discussed above are provided as an "as prepared" nanotube material ("CARBOLEX") that contains about 70% single wall nanotubes produced commercially by a carbon arc process. The nanotubes were not treated or cleaned before being mixed with the decalin solvent. The strength of the drawn fibers produced in accordance with the present invention can be increased by using more highly purified or "clean" nanotubes before the nanotubes are added to the solvent material 108.

For example, in one method, single walled carbon nanotubes may be provided in combination with catalyst particles and silica support due to the process used for producing the nanotubes. To purify the nanotubes, a caustic treatment could be used to remove any silica and then an acid treatment could be used to remove any catalyst material for example, as shown in U.S. Pat. No. 6,413,487, the entire specification of which is hereby expressly incorporated herein by reference.

EXAMPLE 2

In an alternative embodiment the nanotubes were dispersed in toluene, rather than decalin, before addition of polypropylene and the process was followed as previously described in Example 1. Notably, it was found that sonicating carbon nanotubes in toluene for a relatively short time (e.g., 30 minutes) provided a uniformly dispersed suspension of the carbon nanotube material that was stable for several days, unlike carbon nanotubes mixed in decalin, which settled out of suspension soon after ultrasonic mixing was ceased. Additionally, mixtures of solvents such as toluene and decalin, for example at concentrations of 20, 40, 50, 60, and 80 vol. % (prior to mixing) were used, as described below, and in Example 1.

In the present embodiment of the method, carbon nanotube material was combined with toluene to form a nanotube/solvent mixture which was sonicated for 30 minutes. In a separate container, polypropylene was heated and dissolved in decalin to form a matrix/solvent mixture. After ultrasonic mixing, the nanotube/solvent mixture was combined with the matrix/solvent mixture which was further mixed by sonication, forming a nanotube/solvent/matrix mixture. The nanotube/solvent/matrix mixture was sonicated for additional 35 minutes, after which the mixture was removed from the heat and allowed to dry as before to form the nanotube/matrix composite mixture for further processing.

Changes may be made in the combinations, operations, and arrangements of the various components, elements and processes described herein without departing from the spirit and scope of the invention as defined in the following claims.

CITED REFERENCES

Andrews, R.; Jacques, D.; Rao, A. M.; Rantell, T.; Derbyshire, F. "Nanotube composite carbon fibers", *Appl. Phys. Lett.*, 1999, 75(9), 1329–1331.
Bower, C.; Rosen, R.; Jin, L. "Deformation of carbon nanotubes in nanotube-polymer composites", *Appl. Phys. Lett.*, 1999, 74(22), 3317–3319.
Calvert, P., "Potential applications of Nanotubes", in *Carbon Nanotubes: Preparation and Properties* by T. W. Ebbesen, CRC, Boca Raton, 1997, pp. 284, 289.
Garg, A.; Sinnott, S. B. "Effect of chemical functionalization on the mechanical properties of carbon nanotubes", *Chem. Phys. Lett.*, 1998, 295, 273.
Gong, X.; Liu, J.; Baskaran, S.; Voise, R. D.; Young, J. S. "Surfactant-Assisted Processing of Carbon Nanotube/Polymer Composites", 2000, ACS web published.
Haggenmueller, R.; Gommans, H. H.; Rinzler, A. G.; Fischer, J. E.; Winey, K. I. "Aligned single-wall carbon nanotubes in composites by melt processing methods", *Chem. Phys. Lett.*, 2000, 330, 219.
Harris, P. J. F. *Carbon Nanotubes and Related Structures*, Cambridge University Press, Cambridge, U.K., 1999, pp. 5–7, 203, 204.
Milling, A.; Vincent, B.; Emmett, S.; Jones. A. *Colloids Surf.*, 1991, 57, 185.
Ruoff, R. S.; Lorents, D. C. "Mechanical and thermal properties of carbon nanotubes", in *Carbon Nanotubes* edited by M. Endo, S. Iijima, and M. S. Dresselhaus, Pergamon, Exeter, U.K., 1996, p. 148.
Schadler, L. S.; Giannaris, S. C.; Ajayan, P. M. "Load transfer in carbon nanotube epoxy composites", *Appl. Phys. Lett.*, 1998, 73(26), 3842–3844.
Shaffer, M. S. P.; Windle, A. H. "Fabrication and characterization of carbon nanotube/poly(vinyl alcohol) composites", *Advanced Materials*, 1999, 11(11), 937–941.
Vincent, B., in *Solid/Liquid Dispersions*, edited by T. F. Tadros, Academic Press, London, 1987, p. 149.

What is claimed is:

1. A method for forming a nanotube/matrix composite mixture, comprising the steps of:
   a. combining an amount of single walled carbon nanotubes with a solvent material to form a nanotube/solvent mixture and mixing the nanotube/solvent mixture for a predetermined mixing period such that the single walled carbon nanotubes are uniformly dispersed in the nanotube/solvent mixture;
   b. combining an amount of a matrix material with the single walled nanotube/solvent mixture having the single walled carbon nanotubes uniformly dispersed therein to form a nanotube/solvent/matrix mixture and mixing the nanotube/solvent/matrix mixture for a predetermined mixing period such that the single walled carbon nanotubes are uniformly dispersed in the nanotube/solvent/matrix mixture, the matrix material is polypropylene; and
   c. removing a substantial amount of the solvent material from the nanotube/solvent/matrix mixture to form a nanotube/matrix composite mixture comprising less than about 5% by weight of the solvent material.

2. The method of claim 1, wherein the solvent is decalin, toluene, or a combination thereof.

3. The method of claim 1, wherein in step (a) the nanotube solvent mixture further comprises a surfactant.

4. The method of claim 1, further comprising the steps of:
   d. heating the nanotube/matrix composite mixture to a temperature above the melting point of the matrix material; and
   e. passing the heated nanotube/matrix composite mixture through an orifice to form an extrudate.

5. The method of claim 4, further comprising the step of:
   f. drawing the extrudate to form a drawn fiber.

6. The method of claim 5, wherein step (f) is further defined as the steps of passing the extrudate through an oven and simultaneously stretching the extrudate wherein the drawn fiber has a diameter less than a diameter of the extrudate.

7. The method of claim 1 wherein the nanotube/matrix composite mixture formed in step (c) comprises from about 0.5% to 1.5% by weight of single walled carbon nanotubes after step (d).

8. The method of claim 1 wherein in step (a) the solvent material comprises more that one solvent.

9. The method of claim 1 wherein the predetermined mixing period of step (a) is a length of time such that the single walled carbon nanotubes remain substantially unbroken before step (b).

10. The method of claim 9 wherein the predetermined mixing period of step (b) is a length of time such that the single walled carbon nanotubes remain substantially unbroken before step (c).

11. A method for forming a nanotube/matrix composite mixture, comprising the steps of:
   a. combining an amount of single walled carbon nanotubes with a first solvent material to form a nanotube/solvent mixture and mixing the nanotube/solvent mixture for a predetermined mixing period such that the single walled carbon nanotubes are uniformly dispersed in the nanotube/solvent mixture;
   b. combining an amount of a matrix material with a second solvent material to form a matrix/solvent mixture and mixing the matrix material and the second solvent material in the matrix/solvent mixture, the second solvent material being miscible with the first solvent material, the matrix material is polypropylene;
   c. combining the nanotube/solvent mixture with the matrix/solvent mixture to form a nanotube/solvent/matrix mixture and mixing the nanotube/solvent/matrix mixture for a predetermined mixing period such that the single walled carbon nanotubes therein are uniformly dispersed in the nanotube/solvent/matrix mixture; and
   d. removing the first and second solvent materials from the nanotube/solvent/matrix mixture to form a nanotube/matrix composite mixture comprising less than about 5% by weight of the first and second solvent materials.

12. The method of claim 11, wherein the first solvent material and the second solvent material are selected from the group consisting of decalin, toluene, and combinations thereof.

13. The method of claim 11, wherein step (a) further comprises combining a surfactant material with the nanotube/solvent mixture and/or step (b) further comprises combining a surfactant with the matrix/solvent mixture.

14. The method of claim 11, further comprising the steps of:
   e. heating the nanotube/matrix composite mixture to a temperature above the melting point of the matrix material; and
   f. passing the heated nanotube/matrix composite mixture through an orifice to form an extrudate.

15. The method of claim 11, further comprising the steps of:
   g. drawing the extrudate to form a drawn fiber.

16. The method of claim 15, wherein step (g) is further defined as the steps of passing the extrudate through an oven and simultaneously stretching the extrudate wherein the drawn fiber has a diameter less than a diameter of the extrudate.

17. The method of claim 11 wherein the nanotube/matrix composite mixture formed in step (d) comprises from about 0.5% to 1.5% by weight of single walled carbon nanotubes.

18. The method of claim 11 wherein in step a the solvent material comprises more that one solvent.

19. The method of claim 11 wherein the predetermined mixing period of step (a) is a length of time such that the single walled carbon nanotubes remain substantially unbroken before step (b).

20. The method of claim 19 wherein the predetermined mixing period of step (b) is a length of time such that the single walled carbon nanotubes remain substantially unbroken before step (c).

* * * * *